United States Patent
Chen

(10) Patent No.: US 9,013,929 B2
(45) Date of Patent: Apr. 21, 2015

(54) FLASH MEMORY DEVICE AND METHOD FOR HANDLING POWER FAILURE THEREOF

(71) Applicant: Silicon Motion, Inc., Jhubei (TW)

(72) Inventor: Hung-Chiang Chen, Hsinchu (TW)

(73) Assignee: Silicon Motion, Inc., Jhubei (TW)

( * ) Notice: Subject to any disclaimer, the term of this patent is extended or adjusted under 35 U.S.C. 154(b) by 0 days.

(21) Appl. No.: 14/485,285

(22) Filed: Sep. 12, 2014

(65) Prior Publication Data

US 2015/0003154 A1 Jan. 1, 2015

Related U.S. Application Data

(62) Division of application No. 13/453,495, filed on Apr. 23, 2012, now Pat. No. 8,879,347.

(30) Foreign Application Priority Data

Apr. 25, 2011 (TW) .............................. 100114231 A

(51) Int. Cl.
*G11C 11/34* (2006.01)
*G11C 16/10* (2006.01)
*G11C 16/30* (2006.01)
*G11C 16/04* (2006.01)

(52) U.S. Cl.
CPC ................ *G11C 16/10* (2013.01); *G11C 16/30* (2013.01)

(58) Field of Classification Search
CPC ............ G11C 7/00; G11C 5/14; G11C 16/22; G11C 16/225
USPC ............... 365/226, 227, 228, 185.33, 185.26, 365/185.05, 185.09, 185.23
See application file for complete search history.

(56) References Cited

U.S. PATENT DOCUMENTS

2009/0196100 A1 * 8/2009 Merry et al. .............. 365/185.04
2011/0128785 A1 * 6/2011 Seo .......................... 365/185.04

* cited by examiner

*Primary Examiner* — Hien Nguyen
(74) *Attorney, Agent, or Firm* — Wang Law Firm, Inc.; Li K. Wang; Stephen Hsu

(57) ABSTRACT

A flash memory device. In one embodiment, the flash memory device includes a flash memory, a diode, a controller, and a capacitor. The flash memory has a voltage source pin. The diode is coupled between a voltage source and the voltage source pin of the flash memory. The controller is coupled to the flash memory via a data bus. The capacitor is coupled between the voltage source pin of the flash memory and a ground, and supplies power to the flash memory to enable the flash memory to complete writing of at least one data page when the level of the voltage source is lowered.

6 Claims, 3 Drawing Sheets

FLASH MEMORY DEVICE AND METHOD FOR HANDLING POWER FAILURE THEREOF

CROSS REFERENCE TO RELATED APPLICATIONS

This Application is a divisional of U.S. Ser. No. 13/453,495, filed on Apr. 23, 2012, which claims the benefit of priority to Taiwan Patent Application No. 100114231, filed on Apr. 25, 2011, the entirety of which are incorporated by reference herein.

BACKGROUND OF THE INVENTION

1. Field of the Invention

The invention relates to flash memory devices, and more particularly to power failure handling of flash memory devices.

2. Description of the Related Art

Flash memories are classified into single-level-cell (SLC) flash memories, multiple-level-cell (MLC) flash memories, and triple-level-cell (TLC) flash memories. An MLC flash memory and a TLC flash memory have a data capacity higher than that of an SLC flash memory. A memory cell of an SLC flash memory can only store a data bit. A memory cell of an MLC flash memory, however, can store two data bits, and the two data bits of a memory cell respectively belong to a strong page and a corresponding weak page. A memory cell of a TLC flash memory can store three data bits, and the three data bits of a memory cell respectively belong to a strong page, a corresponding weak page, and a corresponding very weak page.

Ordinarily, when a controller receives data to be written to a flash memory, the controller sequentially writes the data to a plurality of pages of the flash memory. When data are sequentially written into a strong page and a corresponding weak page of an MLC flash memory, the data written to the weak page affects the data previously written to the corresponding strong page. Similarly, when data are sequentially written into a strong page, a corresponding weak page, and a corresponding very weak page of a TLC flash memory, the data written to the weak page affects the data previously written to the corresponding strong page, and the data written to the very weak page affects the data previously written to the corresponding strong page and the corresponding weak page.

Because a flash memory is usually used in a portable device for data storage, and portable devices are powered by a limited power source such as batteries, the flash memory is often exposed to the risk of power failure. Because subsequent data writing affects previous data stored in an MLC flash memory and a TLC flash memory, when a power supplied to the MLC flash memory and the TLC flash memory are suddenly turned off, subsequent data written to the MLC flash memory and the TLC flash memory may be halted or damaged, and the data previously stored in the MLC flash memory and the TLC flash memory may be damaged due to the destruction of subsequent data. A flash memory device capable of avoiding data from being damaged due to power failure is therefore required.

BRIEF SUMMARY OF THE INVENTION

The invention provides a flash memory device. In one embodiment, the flash memory device comprises a flash memory, a controller, and a power failure handling circuit. The flash memory has a voltage source pin and a first ready/busy pin, wherein the voltage source pin is coupled to a voltage source. The controller has a second read/busy pin, wherein the second ready/busy pin is coupled to the first ready/busy pin, and when the flash memory processes a first write command, the flash memory sets the voltage of the first ready/busy pin to be equal to a specific level. The power failure handling circuit is coupled between the voltage source and the second ready/busy pin, detects whether the level of the voltage source has been kept at a predetermined level, and sets the level of the second ready/busy pin to be the specific level to prevent the controller from sending a second write command to the flash memory when the level of the voltage source is lower than the predetermined level.

The invention further discloses a flash memory device. In one embodiment, the flash memory device comprises a flash memory, a diode, a controller, and a capacitor. The flash memory has a voltage source pin. The diode is coupled between a voltage source and the voltage source pin of the flash memory. The controller is coupled to the flash memory via a data bus. The capacitor is coupled between the voltage source pin of the flash memory and a ground, and supplies power to the flash memory to enable the flash memory to complete writing of at least one data page when the level of the voltage source is lowered.

The invention further provides a method for handling power failure of a flash memory device. In one embodiment, the flash memory device comprises a controller, a flash memory, and a power failure handing circuit. First, a first ready/busy pin of the flash memory is coupled to a second ready/busy pin of the controller, wherein when the flash memory processes a first write command, the flash memory sets the voltage of the first ready/busy pin to be equal to a specific level. A power failure handling circuit is then coupled between a voltage source and the second ready/busy pin of the controller. Whether the level of the voltage source has been kept at a predetermined level is then detected with the power failure handing circuit. When the level of the voltage source is lower than the predetermined level, the level of the second ready/busy pin is set to be the specific level with the power failure handling circuit to prevent the controller from sending a second write command to the flash memory.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
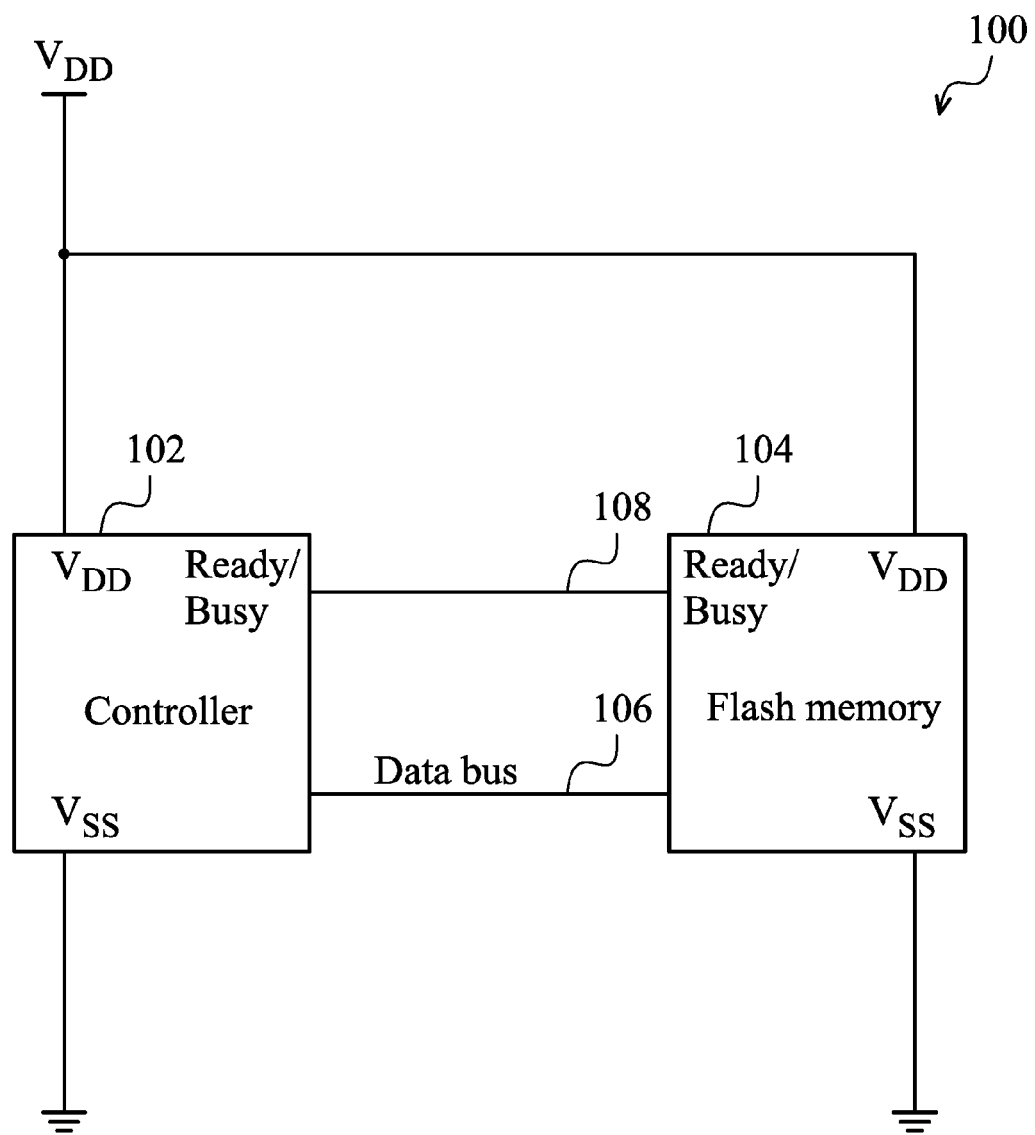
FIG. 1 is a circuit diagram of a flash memory device.

Referring to FIG. 1, a circuit diagram of a flash memory device 100 is shown. The flash memory device 100 comprises a controller 102 and a flash memory 104. In one embodiment, the flash memory 104 is a multiple-level-cell (MLC) flash memory or a triple-level-cell (TLC) flash memory. A voltage source pin of the controller 102 is coupled to a voltage source $V_{DD}$, and a ground pin of the controller 102 is coupled to ground. Similarly, a voltage source pin of the flash memory 104 is coupled to the voltage source $V_{DD}$, and a ground pin of the flash memory 104 is coupled to ground. A data bus 106 is coupled between the controller 102 and the flash memory 104. The data bus 106 is used to transfer data between the controller 102 and the flash memory 104. A ready/busy pin of the controller 102 is coupled to a ready/busy pin of the flash memory 104 via a metal line 108.

When the controller 102 wants to write data to the flash memory 104, the controller 102 sends a first write command and first data to the flash memory 104. The flash memory 104 then writes the data to a plurality of pages of the flash memory 104 according to the first write command. When the flash memory 104 has not completely written the data to the pages, the flash memory 104 pulls the voltage of the ready/busy pin down to the ground level to prevent the controller 102 from sending a second write command and second data to the flash memory 104.

When the power of the voltage source $V_{DD}$ is off, the voltage source $V_{DD}$ cannot supply any more energy to the controller 102 and the flash memory 104. If the flash memory 104 has not completed data writing, because the power supply of the flash memory 104 is halted, the data being written to current pages of the flash memory 104 is destroyed. In addition, the data previously stored in the pages corresponding to the current pages may also be damaged. For example, assume that the flash memory 104 is an MLC flash memory. When second data is written to a weak page of the flash memory 104, and power failure occurs, data previously stored in the strong page corresponding to the weak page may also be damaged. Assume that the flash memory 104 is a TLC flash memory. When second data is written to a very weak page of the flash memory 104, and power failure occurs, data previously stored in a strong page and a weak page corresponding to the very weak page may also be damaged.

Figure 2:
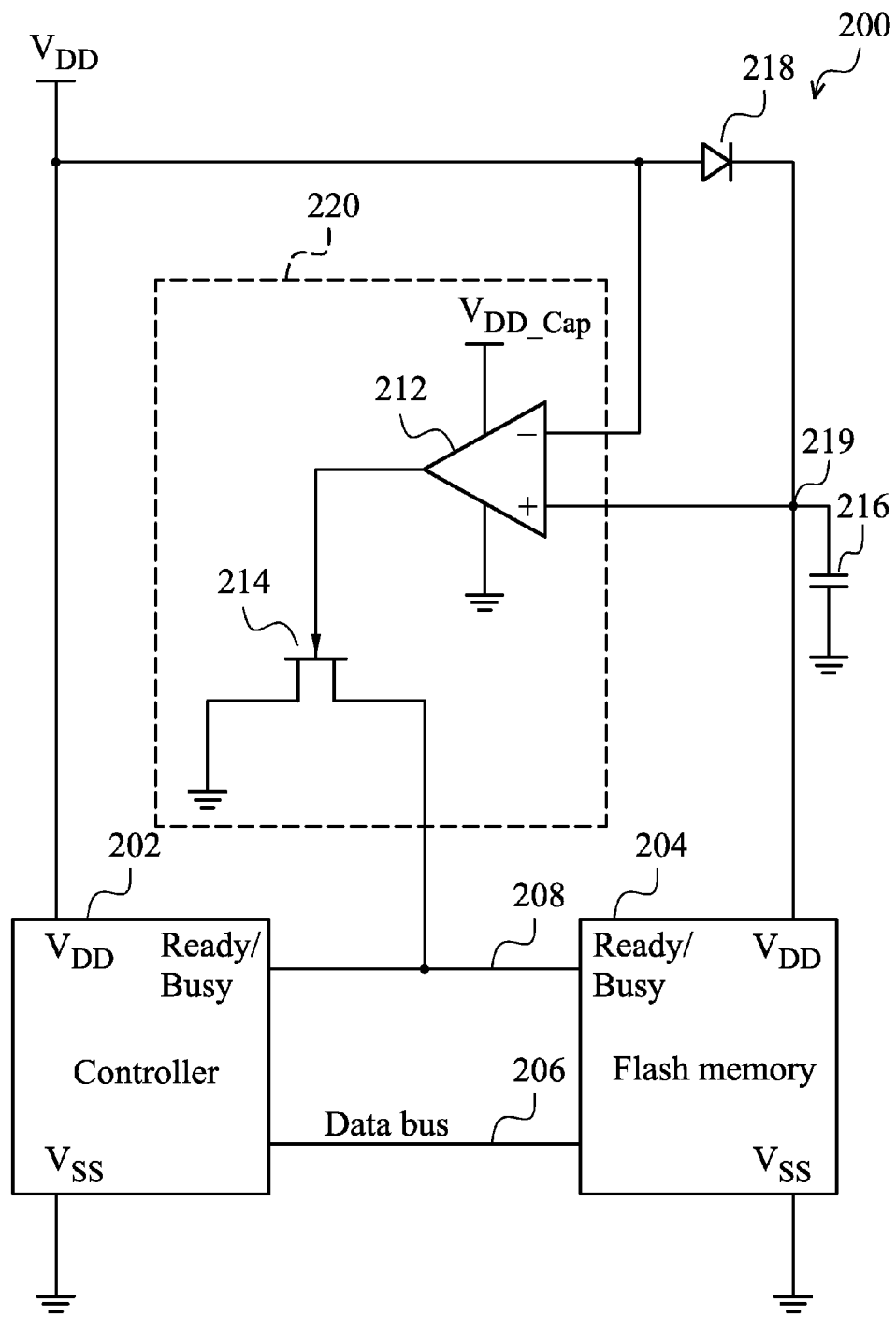
FIG. 2 is a circuit diagram of a flash memory device capable of preventing data from being damaged due to power failure according to the invention.

Referring to FIG. 2, a circuit diagram of a flash memory device 200 capable of preventing data from being damaged due to power failure according to the invention is shown. In one embodiment, the flash memory device 200 comprises a controller 202, a flash memory 204, a power failure handling circuit 220, a diode 218, and a capacitor 216. In one embodiment, the flash memory 204 is a multiple-level-cell (MLC) flash memory or a triple-level-cell (TLC) flash memory. A voltage source pin of the controller 202 is coupled to a voltage source $V_{DD}$, and a ground pin of the controller 102 is coupled to ground. The diode 218 is coupled between the voltage source $V_{DD}$ and a node 219. A voltage source pin of the flash memory 204 is coupled to the voltage source $V_{DD}$, and a ground pin of the flash memory 204 is coupled to ground.

The capacitor 216 is coupled between the node 219 and ground. When the voltage level of the voltage source $V_{DD}$ has been kept at a logic high level, the diode 218 is turned on, the voltage level of the node 219 is the same as that of the voltage source $V_{DD}$, and the power of the voltage source $V_{DD}$ is therefore supplied to the flash memory 204. When the voltage level of the voltage source $V_{DD}$ has been kept at a logic high level, the current flowing through the node 219 charges the capacitor 219 coupled between the node 219 and ground, and the capacitor 219 therefore stores electric power therein. When the voltage source $V_{DD}$ is suddenly turned off, the voltage level of the voltage source $V_{DD}$ is reduced, but the voltage level of the node 219 is still kept at the logic high level due to the power stored in the capacitor 216. The diode 218 is therefore inversely biased and turned off, and the voltage source $V_{DD}$ is decoupled from the node 219. The capacitor 216 then supplies a power stored therein to the flash memory 204 to enable the flash memory 204 to continue to operate for a short period. If the flash memory 204 has not completed data writing when the voltage source $V_{DD}$ is turned off, the flash memory 204 can still operate according to the power supplied by the capacitor 216 to complete data writing. Data damage therefore does not occur on the last data page of the flash memory 204. The flash memory 204 therefore prevents data stored therein from being damaged due to power failure.

The capacitance of the capacitor 216 is calculated according to the specification of the flash memory 204. The capacitance of the capacitor 216 is determined according to a data programming time period, an operating current level, and an operating voltage level. Assume that a time period T for programming a data page of the flash memory 204 is 10 ms, an operating current level I is 50 mA, an operating voltage level is 1.8V, and the level of the voltage source $V_{DD}$ is 3.3V. The capacitance C of the capacitor 216 is calculated according to the following algorithm:

$$I \times T = C \times (V_{DD} - V);$$

$$\begin{aligned} C &= I \times T / (V_{DD} - V) \\ &= 50 \times 10^{-3} \times 10 \times 10^{-3} / (3.3 - 1.8) \\ &= 333.33 \times 10^{-6} (F); \end{aligned}$$

The capacitance C of the capacitor 216 is therefore almost 333.33 µF.

The controller 202 is coupled to the flash memory 204 via a data bus 206. The data bus 206 is used to transmit data between the controller 202 and the flash memory 204. In addition, a ready/busy pin of the controller 202 is coupled to a ready/busy pin of the flash memory 204 via a metal line. When power failure of the voltage source $V_{DD}$ occurs, the capacitor 216 can still supply power to the flash memory 204 for a short period. If the controller 202 continues to send a second write command to the flash memory 204 after power failure occurs, because the capacitor 216 can only supply the flash memory 204 with power for a short time period, the flash memory 204 cannot complete execution of the second write command, and data damage occurs.

The power failure handling circuit 220 is coupled between the voltage source $V_{DD}$, the node 219, and the metal line 208. The power failure handling circuit 220 compares the voltage level of the voltage source $V_{DD}$ with that of the node 219 to determine whether the voltage level of the voltage source $V_{DD}$ has been lowered. When the voltage level of the voltage source $V_{DD}$ is lowered, the power failure handling circuit 220 then pulls the voltage level of the metal line 208 to ground. When the voltage of the metal line 208 is lowered to ground, the voltage of the ready/busy pin of the controller 202 is also lowered to ground, the controller 202 then determines that the flash memory 204 is still busy with the processing of a first write command, and will not send a second write command and second write data to the flash memory 204. Thus, after power failure of the voltage source $V_{DD}$ occurs, the power failure handling circuit 220 prevents the controller 202 from sending second write commands and second write data to the flash memory 204, and data damage is therefore avoided. In another embodiment, the power failure handling circuit 220 is further coupled to the data bus 206. After power failure of the voltage source $V_{DD}$ occurs, the power failure handling circuit 220 pulls the voltage level of the data bus 206 down to ground to prevent the controller 202 from sending second write data to the flash memory 204.

In one embodiment, the power failure handling circuit 220 comprises a power failure detecting circuit 212 and a voltage setting circuit 214. The power failure detecting circuit 212 compares the voltage level of the voltage source $V_{DD}$ with the voltage level of the node 219 to generate a control signal indicating whether the voltage level of the voltage source $V_{DD}$ has been lowered. In one embodiment, the power failure detecting circuit 212 comprises a comparator 212. A negative input terminal of the comparator 212 is coupled to the voltage source $V_{DD}$, a positive input terminal of the comparator 212 is coupled to the node 219, and an output terminal of the comparator 212 generates the control signal. Because the voltage level of the node 219 is maintained by the capacitor 216, when power failure of the voltage source $V_{DD}$ occurs, the voltage level of the voltage source $V_{DD}$ is lower than that of the node 219, and the comparator 212 then enables the control signal. The voltage setting circuit 214 is coupled to the metal line 208, When the control signal indicates that the voltage level of the voltage source $V_{DD}$ is lower than that of the node 219, the voltage setting circuit 214 then lowers the voltage of the metal line 208 to ground to lower the voltage of the ready/busy pin of the controller 202 to ground. In one embodiment, the voltage setting circuit 214 comprises an NMOS transistor coupled between ground and the metal line 208. The gate of the NMOS transistor is coupled to the control signal generated by the comparator 212. When the control signal indicates that the voltage level of the voltage source $V_{DD}$ is lower than that of the node 219, the NMOS transistor 214 couples the ready/busy pin of the controller 202 to ground via the metal line 208 to prevent the controller 202 from sending second write command to the flash memory 204.

Figure 3:
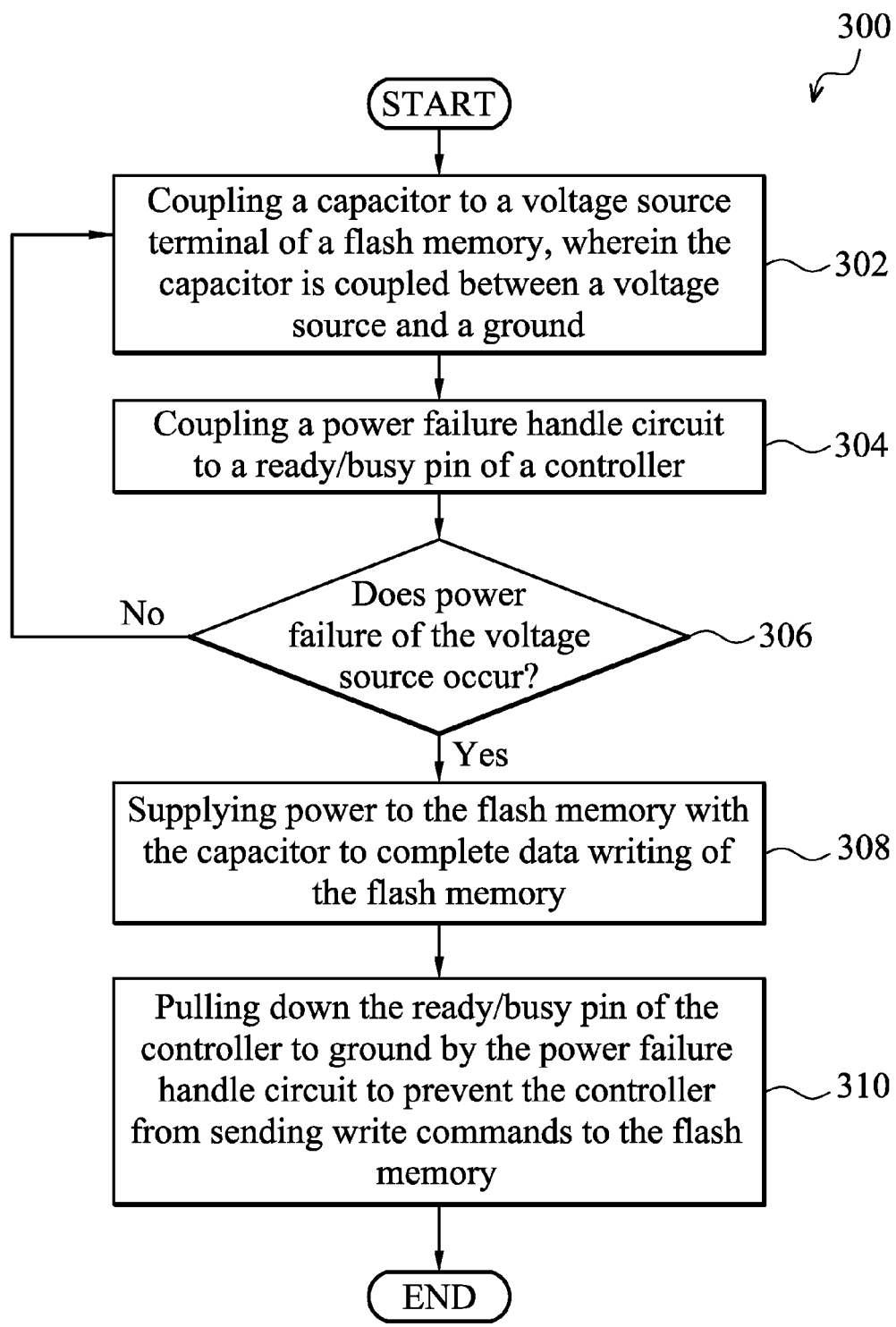
FIG. 3 is a flowchart of a power failure handling method of a flash memory device according to the invention.

Referring to FIG. 3, a flowchart of a power failure handling method 300 of the flash memory device 200 according to the invention is shown. In one embodiment, the flash memory device 200 comprises a controller 202 and a flash memory 204. First, a capacitor 216 is coupled to a voltage source terminal of the flash memory 204, wherein the capacitor 216 is coupled between a voltage source $V_{DD}$ and a ground (step 302). A power failure handle circuit 220 is then coupled to a ready/busy pin of the controller (step 304). Whether power failure of the voltage source $V_{DD}$ occurs is then determined (step 306). When power failure of the voltage source $V_{DD}$ occurs, power is supplied to the flash memory 204 with the capacitor 216 to complete data writing of the flash memory 204 (step 308). Finally, the ready/busy pin of the controller 202 is pulled down to ground by the power failure handle circuit 220 to prevent the controller 202 from sending second write commands to the flash memory 202 (step 310).

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for handling power failure of a flash memory device, wherein the flash memory device comprises a controller, a flash memory, and a power failure handing circuit, the method comprising:

coupling a first ready/busy pin of the flash memory to a second ready/busy pin of the controller, wherein when the flash memory processes a first write command, the flash memory sets the voltage of the first ready/busy pin to be equal to a specific level;

coupling a power failure handling circuit between a voltage source and the second ready/busy pin of the controller;

detecting whether the level of the voltage source has been kept at a predetermined level with the power failure handing circuit;

when the level of the voltage source is lower than the predetermined level, setting the level of the second ready/busy pin to be the specific level with the power failure handling circuit to prevent the controller from sending a second write command to the flash memory.

2. The method as claimed in claim 1, wherein the method further comprises:

coupling a diode between the voltage source and the voltage source pin of the flash memory;

coupling a capacitor between the voltage source pin of the flash memory and a ground; and when the level of the voltage source is lower than the predetermined level, supplying power to the flash memory to enable the flash memory to complete writing of a data page.

3. The method as claimed in claim 2, wherein the power failure handling circuit comprises a power failure detecting circuit and a voltage setting circuit, and the method further comprises:

detecting whether the level of the voltage source has been kept at the predetermined level with the power failure detecting circuit to generate a control signal; and when the control signal indicates that the level of the voltage source is lower than the predetermined level, the voltage of the second ready/busy pin is set to the specific level with the voltage setting circuit.

4. The method as claimed in claim 3, wherein the power failure detecting circuit comprises:

a comparator, coupled between the voltage source and the capacitor, comparing the level of the voltage source with the voltage level of the capacitor, and enabling the control signal when the level of the voltage source is lower than the voltage level of the capacitor.

5. The method as claimed in claim 3, wherein the voltage setting circuit comprises:

a transistor, coupled between the specific level and the second ready/busy pin, having a gate coupled to the control signal, coupling the second ready/busy pin to the specific level when the control signal indicates that the level of the voltage source is lower than the predetermined level.

6. The method as claimed in claim 1, wherein a data bus is coupled between the controller and the flash memory, and the method further comprises:

when the level of the voltage source is lower than the predetermined level, lowering the voltage of the data bus to ground with the power failure handling circuit to prevent the controller from sending the second data to the flash memory.

* * * * *